(12) United States Patent
Liu et al.

(10) Patent No.: US 8,614,453 B2
(45) Date of Patent: Dec. 24, 2013

(54) CHIP-TYPE LIGHT EMITTING DEVICE HAVING PRECISELY COATED WAVELENGTH-CONVERTING LAYER AND PACKAGED STRUCTURE THEREOF

(75) Inventors: Wen-Huang Liu, Hsinchu (TW); Chung-Che Dan, Hsinchu (TW); Yuan-Hsiao Chang, Hsinchu (TW); Hung-Jen Kao, Hsinchu (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 89 days.

(21) Appl. No.: 13/118,336

(22) Filed: May 27, 2011

(65) Prior Publication Data

US 2011/0316027 A1    Dec. 29, 2011

(30) Foreign Application Priority Data

Jun. 29, 2010    (TW) ................................ 99121302 A

(51) Int. Cl.
*H01L 33/00*    (2010.01)

(52) U.S. Cl.
USPC 257/98; 257/100; 257/E33.061; 257/E33.059

(58) Field of Classification Search
USPC .................... 257/79–103, E33.001–E33.061; 438/22–47
See application file for complete search history.

(56) References Cited

U.S. PATENT DOCUMENTS

| | | | |
|---|---|---|---|
| 2004/0084681 A1* | 5/2004 | Roberts | 257/79 |
| 2005/0077529 A1* | 4/2005 | Shen | 257/79 |
| 2006/0105485 A1* | 5/2006 | Basin et al. | 438/27 |
| 2006/0157686 A1* | 7/2006 | Jang et al. | 257/14 |
| 2006/0281203 A1* | 12/2006 | Epler et al. | 438/22 |
| 2007/0170454 A1* | 7/2007 | Andrews | 257/100 |
| 2007/0205423 A1* | 9/2007 | Yamazaki et al. | 257/89 |
| 2008/0048199 A1* | 2/2008 | Ng | 257/98 |
| 2008/0173884 A1* | 7/2008 | Chitnis et al. | 257/98 |
| 2008/0179611 A1* | 7/2008 | Chitnis et al. | 257/98 |
| 2009/0014736 A1* | 1/2009 | Ibbetson et al. | 257/98 |
| 2009/0065790 A1* | 3/2009 | Chitnis et al. | 257/88 |
| 2009/0140630 A1* | 6/2009 | Kijima et al. | 313/498 |
| 2009/0166667 A1* | 7/2009 | Sakata et al. | 257/103 |
| 2009/0261358 A1* | 10/2009 | Chitnis et al. | 257/88 |
| 2010/0200887 A1* | 8/2010 | Urano et al. | 257/98 |
| 2010/0207134 A1* | 8/2010 | Tanaka et al. | 257/89 |
| 2010/0265737 A1* | 10/2010 | Kim | 362/602 |
| 2010/0295078 A1* | 11/2010 | Chen et al. | 257/98 |
| 2011/0085352 A1* | 4/2011 | Ito et al. | 362/617 |

FOREIGN PATENT DOCUMENTS

| | | | | |
|---|---|---|---|---|
| WO | 2009/014219 | * | 1/2009 | H01L 33/00 |
| WO | WO 2009014219 | * | 1/2009 | H01L 33/00 |
| WO | 2009/028611 | * | 3/2009 | H01L 33/00 |
| WO | WO 2009028611 | * | 3/2009 | H01L 33/00 |
| WO | 2009/145298 | * | 12/2009 | H01L 33/00 |
| WO | WO 2009145298 | * | 12/2009 | H01L 33/00 |

* cited by examiner

*Primary Examiner* — Fernando L Toledo
*Assistant Examiner* — Victoria K Hall
(74) *Attorney, Agent, or Firm* — Stephen A. Gratton

(57) ABSTRACT

The invention relates to a chip-type light emitting device including one or more light emitting semiconductors and one or more frames provided over a top of the one or more light emitting semiconductors.

10 Claims, 12 Drawing Sheets

CHIP-TYPE LIGHT EMITTING DEVICE HAVING PRECISELY COATED WAVELENGTH-CONVERTING LAYER AND PACKAGED STRUCTURE THEREOF

CLAIM OF PRIORITY

This application claims the priority benefit of Taiwan Application Serial Number 099121302, filed on Jun. 29, 2010. The entire disclosure of the Taiwan application is incorporated herein by reference.

BACKGROUND OF THE INVENTION

1. Field of the Invention

The invention relates to a light emitting device, particularly to a chip-type light emitting device having a precisely coated wavelength-converting layer and a package structure thereof.

2. Description of Related Art

In a conventional light emitted diode (LED) configuration, it is typical that a fluorescent layer is coated on the LED to convert the wavelengths of emitted light. As a result, the fluorescent layer is also called a wavelength-converting layer. However, since the amount of the fluorescent layer that is coated is difficult to control precisely, the thickness of the fluorescent layer often becomes too thin or too thick, and hence the production of LEDs will have a lower yield and a higher cost. Consequently, a light emitting device having a precisely coated wavelength-converting layer is needed so as to improve the yield and to lower the production cost.

BRIEF SUMMARY OF THE INVENTION

According to an aspect of the invention, provided is a chip-type light emitting device including one or more light emitting semiconductors and one or more frames provided over a top of the one or more light emitting semiconductors.

According to another aspect of the invention, provided is a package structure of the above-mentioned chip-type light emitting device. The package structure includes a leadframe, an attachment layer provided on the leadframe, a substrate provided on the attachment layer, the above-mentioned chip-type light emitting device coupled to the substrate, and one or more bonding pads provided on the chip-type light emitting device.

Additional advantages and other aspects of the invention will be readily apparent from the following detailed description setting forth the principles of the invention with reference to the accompanied drawings.

DETAILED DESCRIPTION OF THE INVENTION

Figure 1:
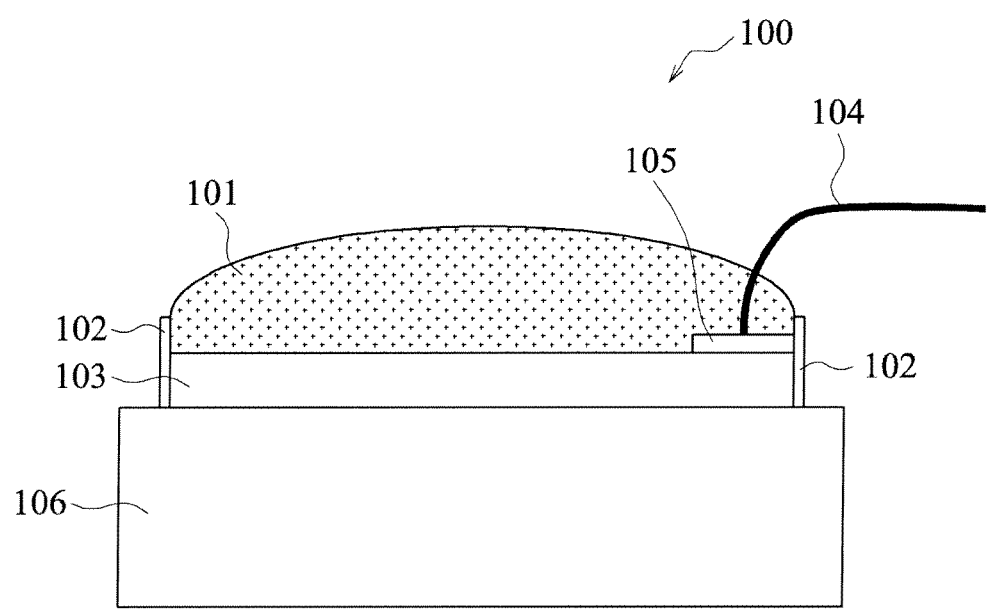
FIG. 1 shows a simplified cross-sectional view of a chip-type light emitting device according to an embodiment of the invention.

FIG. 1 shows a simplified cross-sectional view of a chip-type light emitting device 100 according to an embodiment of the invention. The light emitting device 100 shown in FIG. 1 is a vertical light emitting element. As shown in FIG. 1, the light emitting device 100 includes a light emitting semiconductor 103, a frame 102 provided over a top of the light emitting semiconductor 103, and a wavelength-converting layer 101 applied on the light emitting semiconductor 103 and confined by the frame 102. The light emitting device 100 is coupled to a substrate 106. Alternatively, the light emitting semiconductor 103 with the frame 102 provided thereon can be first coupled to the substrate 106, and then the wavelength-converting layer 101 can be applied on the light emitting semiconductor 103 and is confined by the frame 102. Various embodiments described herein can also have these features. The substrate 106 can be an opaque substrate made of metal, ceramic, or semiconductor. A bonding pad 105 is provided on the light emitting semiconductor 103 and is connected with a wire 104.

The wavelength-converting layer 101 can undergo a heat treatment at a heat treatment temperature of about 60° C. to about 300° C. The wavelength-converting layer 101 can be applied using at least one of precise dispensing, precise stamping, precise jetting, and screen printing. The wavelength-converting layer 101 can include fluorescent particles mixed with one or more organic chemicals (such as silicone resin and/or epoxy resin). Further, a diluting agent such as toluene, heptane, normal hexane, isopropyl alcohol, etc. can be added when mixing the fluorescent particles with the organic chemicals. Alternatively, the wavelength-converting layer 101 can include fluorescent particles mixed with a glass. Moreover, for example, a weight ratio of the fluorescent particles to the organic chemicals (or glass) is about 0.6 to 8; that is, it can be expressed as "amount by weight of fluorescent particles: amount by weight of organic chemicals (or glass) ≈0.6:1 to 8:1". The wavelength-converting layer mixed with the glass as described above is applied at a temperature ranging between about 100° C. and about 500° C. The wavelength-converting layer includes, but not limited to, a convex, a concave, a flat, or a pyramid shape. FIG. 1 shows that the wavelength-converting layer 101 has a convex shape. The wavelength-converting layer 101 can have a thickness of about 1 µm to about 200 µm, preferably of about 10 µm to about 100 µm. The light emitting device 100 can emit a light having a peak wavelength ranging between about 200 nm and about 500 nm. The frame 102 is made of a transparent material such as epoxy resin, silicone resin, polyimide resin, glass, quartz, acryl resin such as polymethylmethacrylate (PMMA) etc., polycarbonate (PC) resin, SU-8 resist, BCB resist, or parylene resin. Alternatively, the frame 102 can be a single metallic layer or multiple metallic layers. The frame 102 can be disposed using at least one of spin coating, dip coating, chemical vapor deposition, thermal evaporation, and e-beam evaporation. The frame 102 can have a thickness of about 0.1 µm to about 200 µm, preferably of about 2 nm to about 100 µm. A light diffusion layer (not shown) can be provided on the wavelength-converting layer 101.

In the various embodiments of the invention shown in the figures, while the frame can be provided over a top of the light emitting semiconductor, it can further extend to cover a side portion of the light emitting semiconductor. In a case where the frame extends to cover a side portion of the light emitting semiconductor, the wavelength-converting layer may or may not encapsulate the side portion of the light emitting semiconductor. For example, the wavelength-converting layer in FIG. 1 does not encapsulate a side portion of the light emitting semiconductor, whereas the wavelength-converting layer in each of FIGS. 3 to 5 encapsulates a side portion of the light emitting semiconductor.

Figure 2:
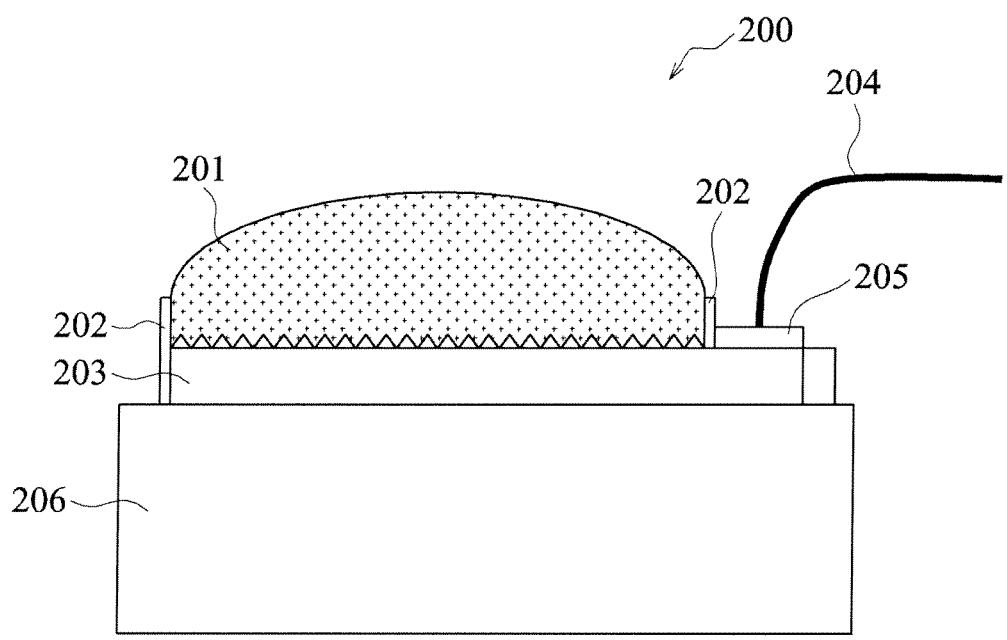
FIG. 2 shows a simplified cross-sectional view of a chip-type light emitting device according to an embodiment of the invention.

FIG. 2 shows a simplified cross-sectional view of a chip-type light emitting device 200 according to an embodiment of the invention. The light emitting device 200 shown in FIG. 2 is a vertical light emitting element. As shown in FIG. 2, the light emitting device 200 includes a light emitting semiconductor 203, a frame 202, and a wavelength-converting layer 201. A surface of the light emitting semiconductor 203 that is adjacent to the wavelength-converting layer 201 can be roughened to enhance light emitting efficiency. The light emitting device 200 is coupled to a substrate 206. A bonding pad 205 is provided on the light emitting semiconductor 203, and the bonding pad 205 is connected with a wire 204. In the embodiments of the invention, the bonding pad can be provided on the light emitting semiconductor and within the frame (as shown in FIG. 1, for example), or it can be provided on the light emitting semiconductor and outside the frame (as shown in FIG. 2, for example).

In an embodiment of the invention, a light emitting device can be assembled in the following order: first forming the frame over a top of the light emitting semiconductor, then coupling the light emitting semiconductor to the substrate, subsequently bonding the wire to the light emitting semiconductor, and finally applying the wavelength-converting layer. Alternatively, a light emitting device can be assembled in the following order: first forming the frame over a top of the light emitting semiconductor, then coupling the light emitting semiconductor to the substrate, subsequently applying the wavelength-converting layer, and finally bonding the wire to the light emitting semiconductor.

Figure 3:
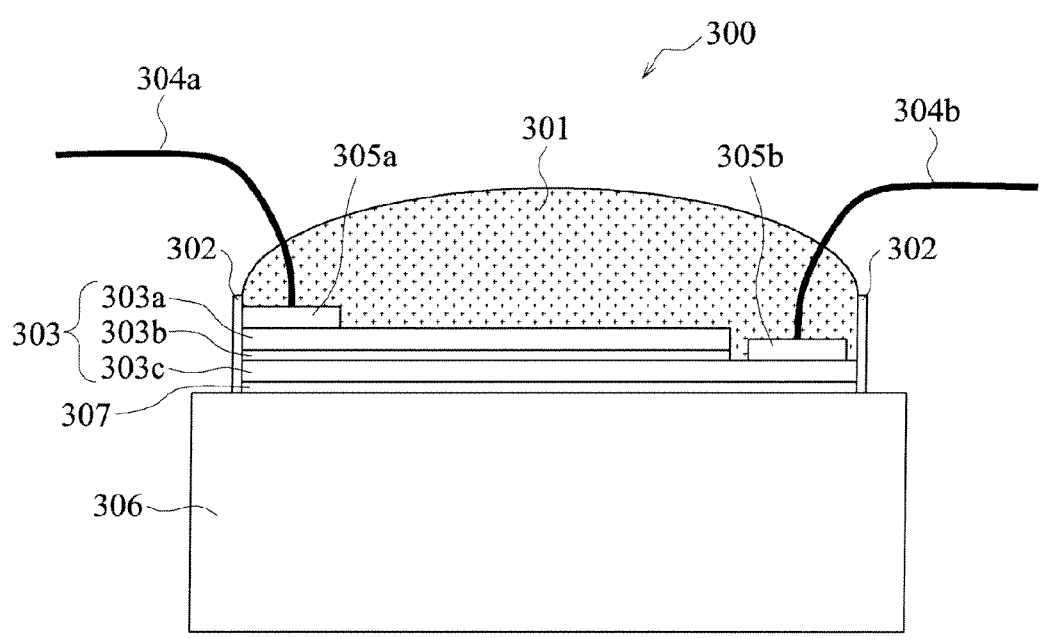
FIG. 3 shows a simplified cross-sectional view of a chip-type light emitting device according to an embodiment of the invention.

FIG. 3 shows a simplified cross-sectional view of a chip-type light emitting device 300 according to an embodiment of the invention. As shown in FIG. 3, the light emitting device 300 includes a light emitting semiconductor 303, a frame 302, and a wavelength-converting layer 301. The light emitting device 300 is coupled to a substrate 306. A first bonding pad 305a (which is provided on an n-type semiconductor layer 303a) and a second bonding pad 305b (which is provided on a p-type semiconductor layer 303c) are provided on the light emitting semiconductor 303 of the light emitting device 300. The first bonding pad 305a and the second bonding pad 305b are connected with a first wire 304a and a second wire 304b, respectively. The light emitting semiconductor 303 can include a p-type semiconductor layer 303c that is adjacent to the substrate 306, an activation layer 303b provided on the p-type semiconductor layer 303c, and an n-type semiconductor layer 303a provided on the activation layer 303b and being adjacent to the wavelength-converting layer 301. In addition, a reflection layer 307 can be provided at a bottom of the light emitting semiconductor 303; that is, it is provided between the substrate 306 and the light emitting device 300. Specifically, the reflection layer 307 is provided between the substrate 306 and the p-type semiconductor layer 303c. The reflection layer 307 can also be adapted to other embodiments of the invention. The light emitting semiconductors according to other embodiments of the invention can have the same or similar configuration as the light emitting semiconductor 303 shown in FIG. 3.

Figure 4:
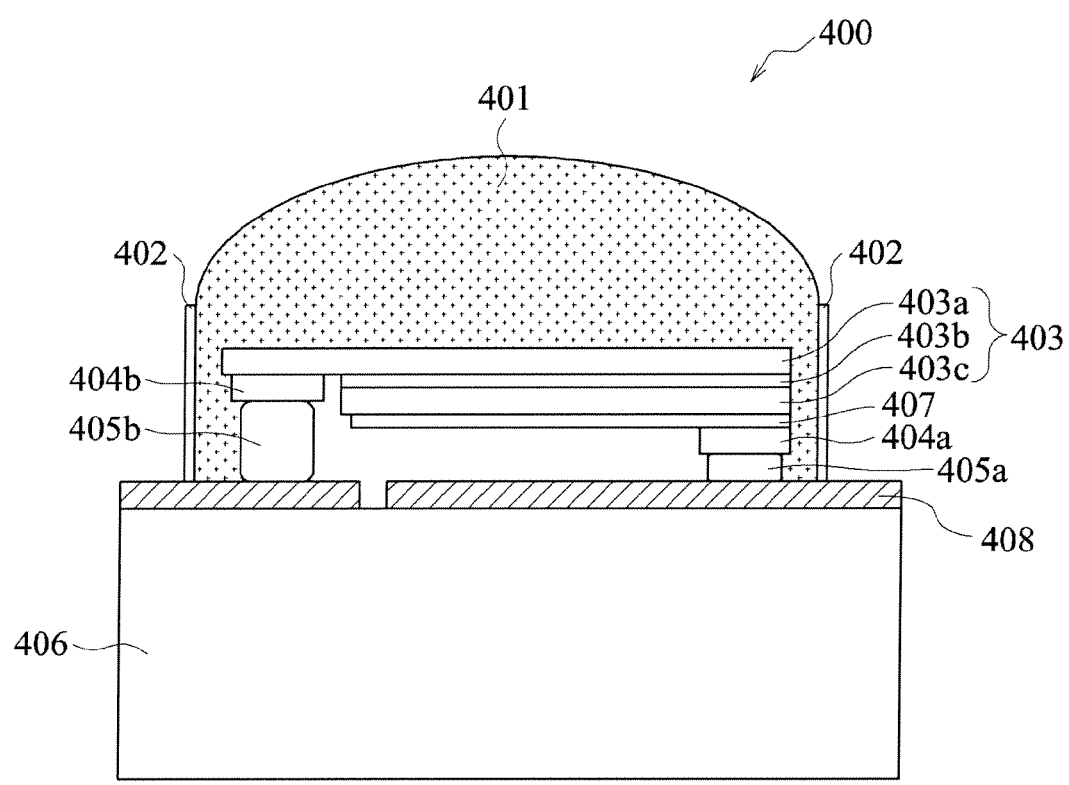
FIG. 4 shows a simplified cross-sectional view of a chip-type light emitting device according to an embodiment of the invention.

FIG. 4 shows a simplified cross-sectional view of a chip-type light emitting device 400 according to an embodiment of the invention. As shown in FIG. 4, the light emitting device 400 includes a light emitting semiconductor 403, a frame 402, and a wavelength-converting layer 401. The light emitting semiconductor 403 includes a p-type semiconductor layer 403c, an activation layer 403b, and an n-type semiconductor 403a. A reflection layer 407 is provided on a bottom (p-type semiconductor layer 403c) of the light emitting semiconductor 403. A first bonding pad 404a is provided on the reflection layer 407, and a second bonding pad 404b is provided on the n-type semiconductor layer 403a. The light emitting device 400 is coupled to a substrate 406, and the first bonding pad 404a and the second bonding pad 404b are connected to a conductive region 408 on the substrate 406 via a first contact 405a and a second contact 405b, respectively. In this embodiment, the light emitting device can be assembled in the following order: first inverting the light emitting semiconductor on the substrate, then forming a frame over a top of the light emitting semiconductor, and finally applying a wavelength-converting layer.

Figure 5:
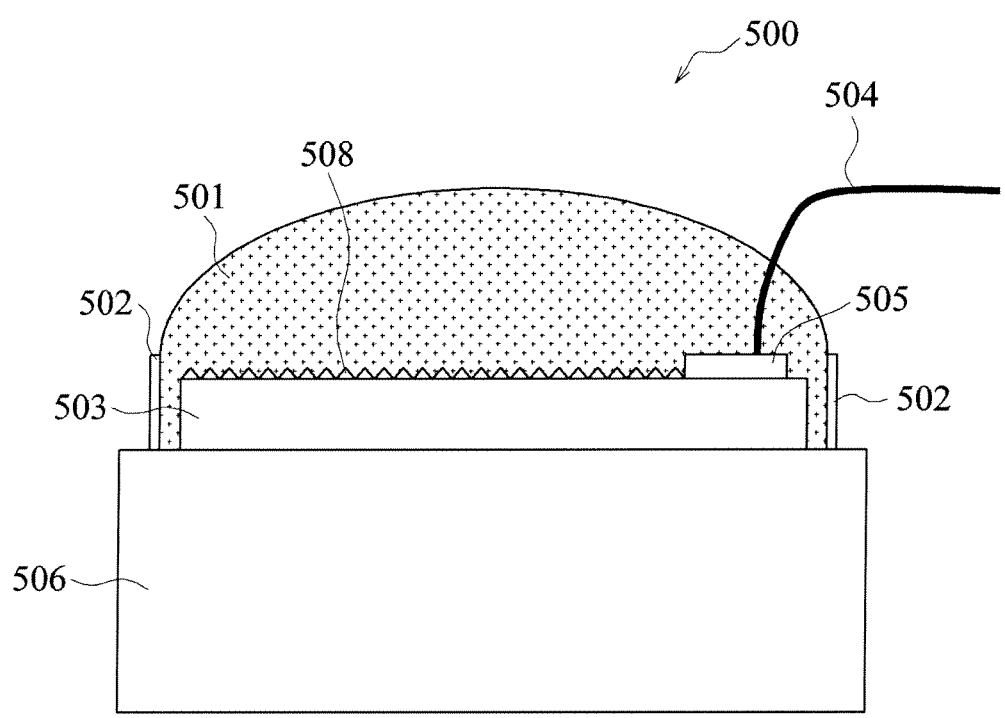
FIG. 5 shows a simplified cross-sectional view of a chip-type light emitting device according to an embodiment of the invention.

FIG. 5 shows a simplified cross-sectional view of a chip-type light emitting device 500 according to an embodiment of the invention. The embodiment depicted in FIG. 5 is similar to that depicted in FIG. 1, except that, in FIG. 5, a wavelength-converting layer 501 encapsulates side portions of a light emitting semiconductor 503 (in a case where a frame 502 extends to cover the side portions of the light emitting semiconductor 503), and that a surface of the light emitting semiconductor 503 is roughened to form a roughened (patterned) surface 508. The light emitting device 500 is coupled to a substrate 506. A bonding pad 505 is provided on the light emitting semiconductor 503, and it is connected with a wire 504.

Figure 6:
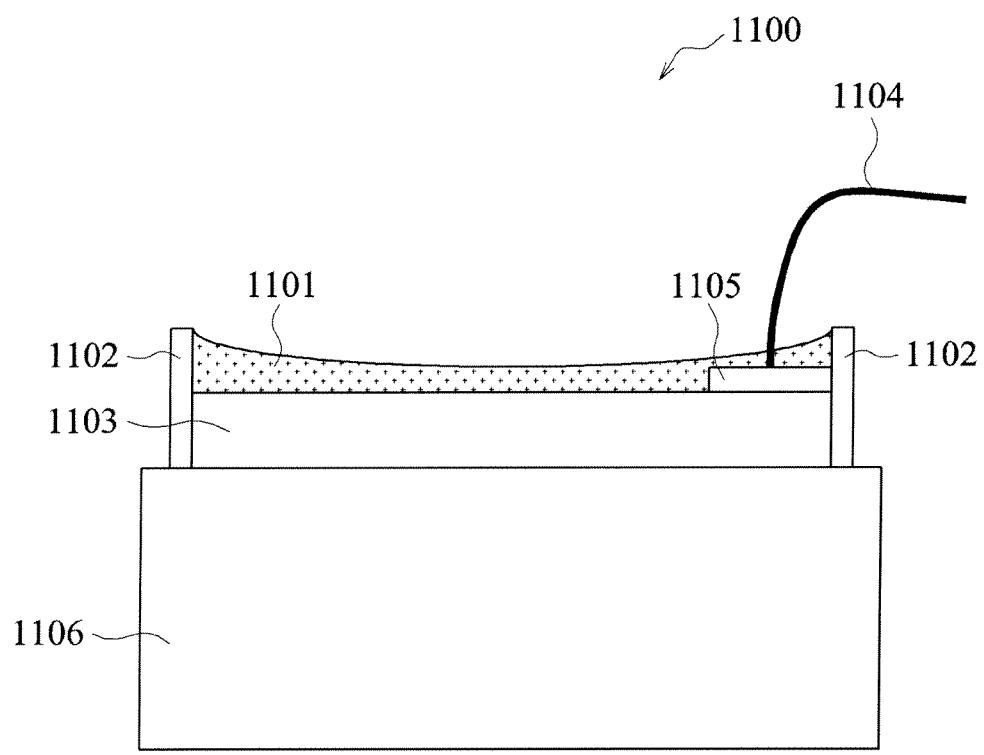
FIG. 6 shows a simplified cross-sectional view of a chip-type light emitting device according to an embodiment of the invention.

FIG. 6 shows a simplified cross-sectional view of a chip-type light emitting device 1100 according to an embodiment of the invention. As shown in FIG. 6, the light emitting device 1100 includes a light emitting semiconductor 1103, a frame 1102, and a wavelength-converting layer 1101, wherein the wavelength-converting layer 1101 has a concave shape. The light emitting device 1100 is coupled to a substrate 1106. A bonding pad 1105 is provided on the light emitting semiconductor 1103, and it is connected with a wire 1104.

Figure 7:
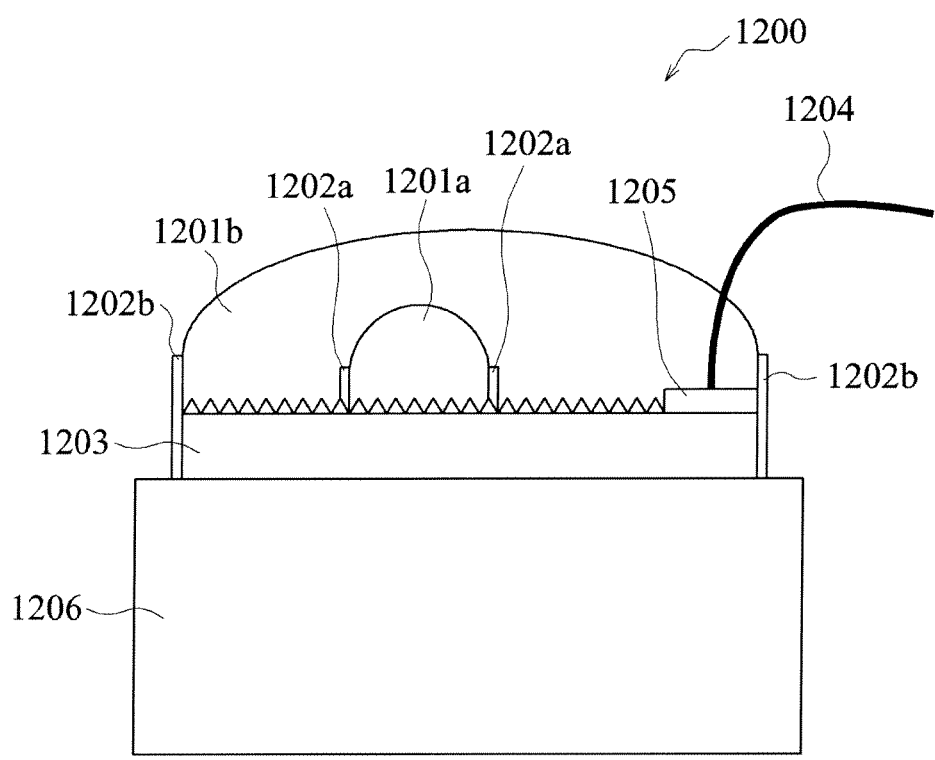
FIG. 7 shows a simplified cross-sectional view of a chip-type light emitting device according to an embodiment of the invention.

FIG. 7 shows a simplified cross-sectional view of a chip-type light emitting device 1200 according to an embodiment of the invention. As shown in FIG. 7, the light emitting device 1200 includes a light emitting semiconductor 1203, a first frame 1202a, a second frame 1202b, a first wavelength-converting layer 1201a, and a second wavelength-converting layer 1201b. The first frame 1202a is surrounded by the second frame 1202*b*. The first wavelength-converting layer 1201*a* is applied to an area on the light emitting semiconductor 1203 that is confined by the first frame 1202*a*, and the second wavelength-converting layer 1201*b* is applied to an area on the light emitting semiconductor 1203 that is confined by the second frame 1202*b*. The second wavelength-converting layer 1201*b* provided within the second frame 1202*b* can encapsulate the first wavelength-converting layer 1201*a* provided within the first frame 1202*a*, thereby forming multiple (overlaid) wavelength-converting layers. The light emitting device 1200 is coupled to a substrate 1206. A bonding pad 1205 is provided on the light emitting semiconductor 1203, and it is connected with a wire 1204.

Figure 8:
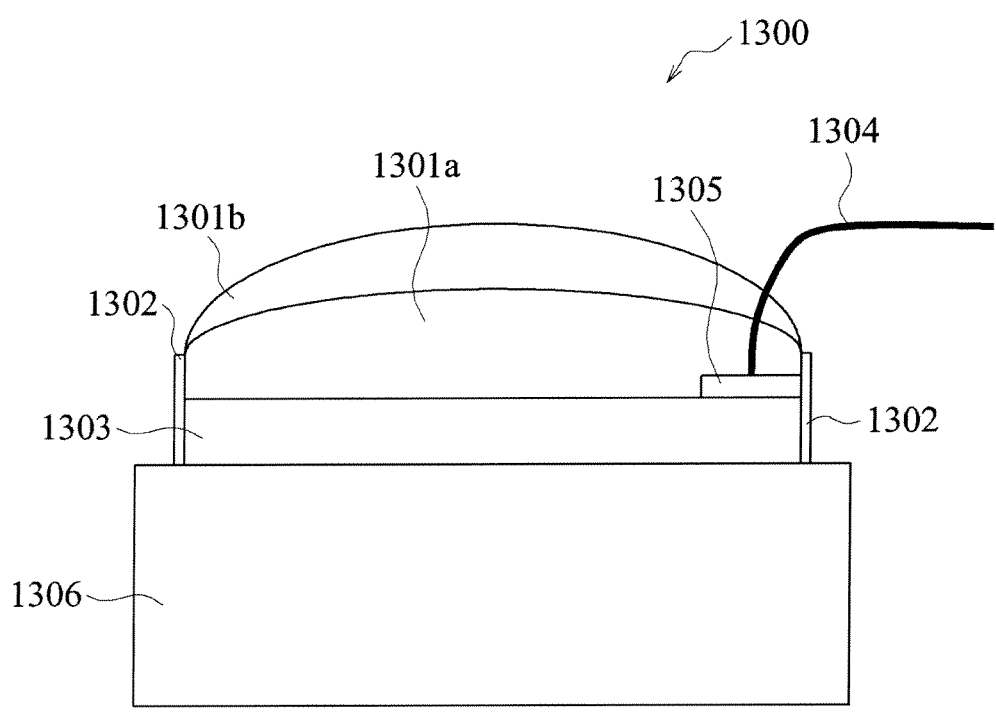
FIG. 8 shows a simplified cross-sectional view of a chip-type light emitting device according to an embodiment of the invention.

FIG. 8 shows a simplified cross-sectional view of a chip-type light emitting device 1300 according to an embodiment of the invention. As shown in FIG. 8, the light emitting device 1300 includes a light emitting semiconductor 1303, a frame 1302, a first wavelength-converting layer 1301*a*, and a second wavelength-converting layer 1301*b*. The embodiment depicted in FIG. 8 is similar to that depicted in FIG. 7, except that, in FIG. 8, the first wavelength-converting layer 1301*a* and the second wavelength-converting layer 1301*b* are applied within the same frame (i.e. frame 1302). The second wavelength-converting layer 1301*b* encapsulates the first wavelength-converting layer 1301*a*, thereby forming multiple (overlaid) wavelength-converting layers. The light emitting semiconductor 1300 is coupled to a substrate 1306. A bonding pad 1305 is provided on the light emitting semiconductor 1303, and it is connected with a wire 1304.

Figure 9:
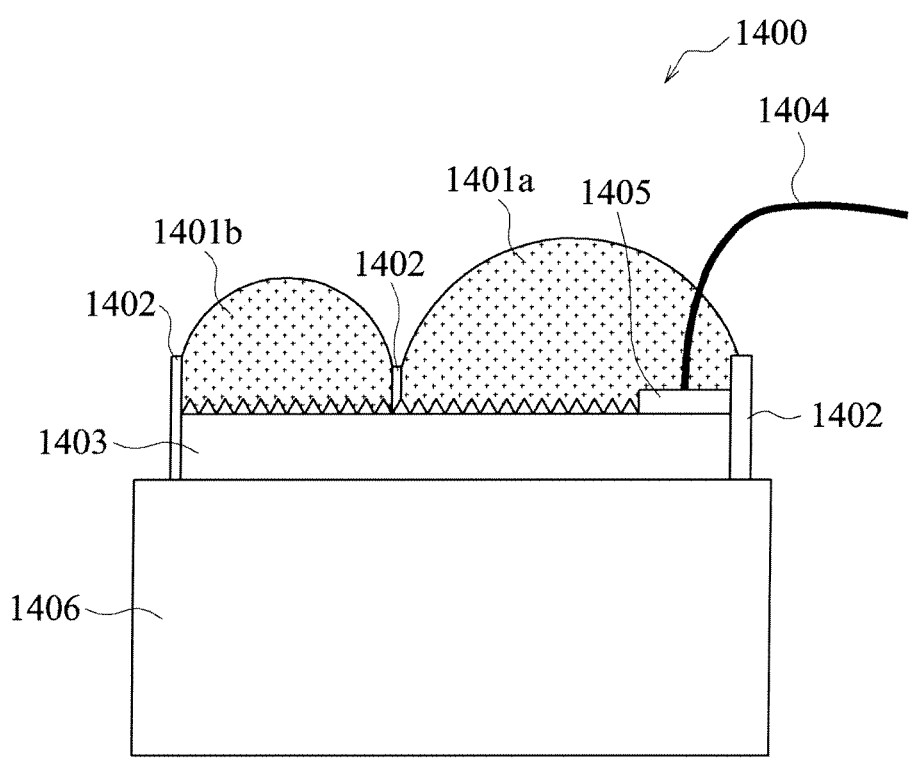
FIG. 9 shows a simplified cross-sectional view of a chip-type light emitting device according to an embodiment of the invention.

FIG. 9 shows a simplified cross-sectional view of a chip-type light emitting device 1400 according to an embodiment of the invention. As shown in FIG. 9, the light emitting device 1400 includes a light emitting semiconductor 1403, a frame 1402, a first wavelength-converting layer 1401*a*, and a second wavelength-converting layer 1401*b*. The frame 1402 provided over a top of the light emitting semiconductor 1403 can divide the light emitting semiconductor 1403 into two regions, within which the first wavelength-converting layer 1401*a* and the second wavelength-converting layer 1401*b* are applied respectively, thereby forming multiple (side-by-side) wavelength-converting layers on the light emitting semiconductor 1403. The light emitting device 1400 is coupled to a substrate 1406. A bonding pad 1405 is provided on the light emitting semiconductor 1403, and it is connected with a wire 1404. In addition, in the embodiments of the invention, a wavelength-converting layer can encapsulate a portion of a frame without overflowing from the confinement of the frame. For example, as shown in FIG. 9, the first wavelength-converting layer 1401*a* encapsulates a portion of the frame 1402 that is shown on the right of the figure, but it does not overflow from the frame 1402.

Figure 10:
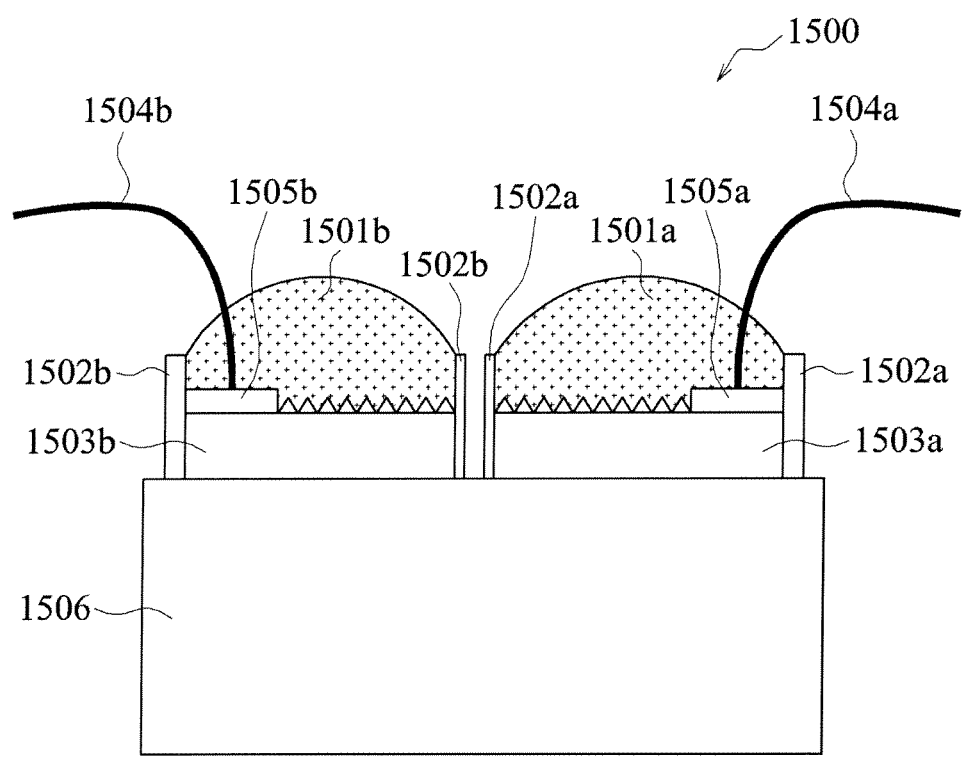
FIG. 10 shows a simplified cross-sectional view of a chip-type light emitting device according to an embodiment of the invention.

FIG. 10 shows a simplified cross-sectional view of a chip-type light emitting device 1500 according to an embodiment of the invention. As shown in FIG. 10, the light emitting device 1500 includes a first light emitting semiconductor 1503*a*, a second light emitting semiconductor 1503*b*, a first frame 1502*a* provided over a top of the first light emitting semiconductor 1503*a*, a second frame 1502*b* provided over a top of the second light emitting semiconductor 1503*b*, a first wavelength-converting layer 1501*a* applied on the first light emitting semiconductor 1503*a* and confined by the first frame 1502*a*, and a second wavelength-converting layer 1501*b* applied on the second light emitting semiconductor 1503*b* and confined by the second frame 1502*b*. The first light emitting semiconductor 1503*a* and the second light emitting semiconductor 1503*b* are respectively coupled to a substrate 1506. A first bonding pad 1505*a* is provided on the first light emitting semiconductor 1503*a*, and a second bonding pad 1505*b* is provided on the second light emitting semiconductor 1503*b*. The first bonding pad 1505*a* and the second bonding pad 1505*b* are connected with a first wire 1504*a* and a second wire 1504*b*, respectively. In the embodiment shown in FIG. 10, the first wavelength-converting layer 1501*a* and the second wavelength-converting layer 1501*b* are applied within the first frame 1502*a* and the second frame 1502*b*, respectively. Alternatively, features of the embodiment shown in FIG. 9 can be adapted to the embodiment shown in FIG. 10. Specifically, the frame shown in FIG. 9 can be provided over each of the first light emitting semiconductor 1503*a* and the second light emitting semiconductor 1503*b* shown in FIG. 10, thereby forming multiple (side-by-side) wavelength-converting layers on each of the first light emitting semiconductor 1503*a* and the second light emitting semiconductor 1503*b*. Still alternatively, features of the embodiment shown in FIG. 7 or 8 can be adapted to the embodiment shown in FIG. 10 to form multiple (overlaid) wavelength-converting layers on each of the first light emitting semiconductor 1503*a* and the second light emitting semiconductor 1503*b*. Moreover, the embodiment shown in FIG. 10 can include the concave wavelength-converting layer shown in FIG. 6. Further, different or the same currents may be passed to the first light emitting semiconductor 1503*a* and the second light emitting semiconductor 1503*b* via the first wire 1504*a* and the second wire 1504*b*.

Figure 11:
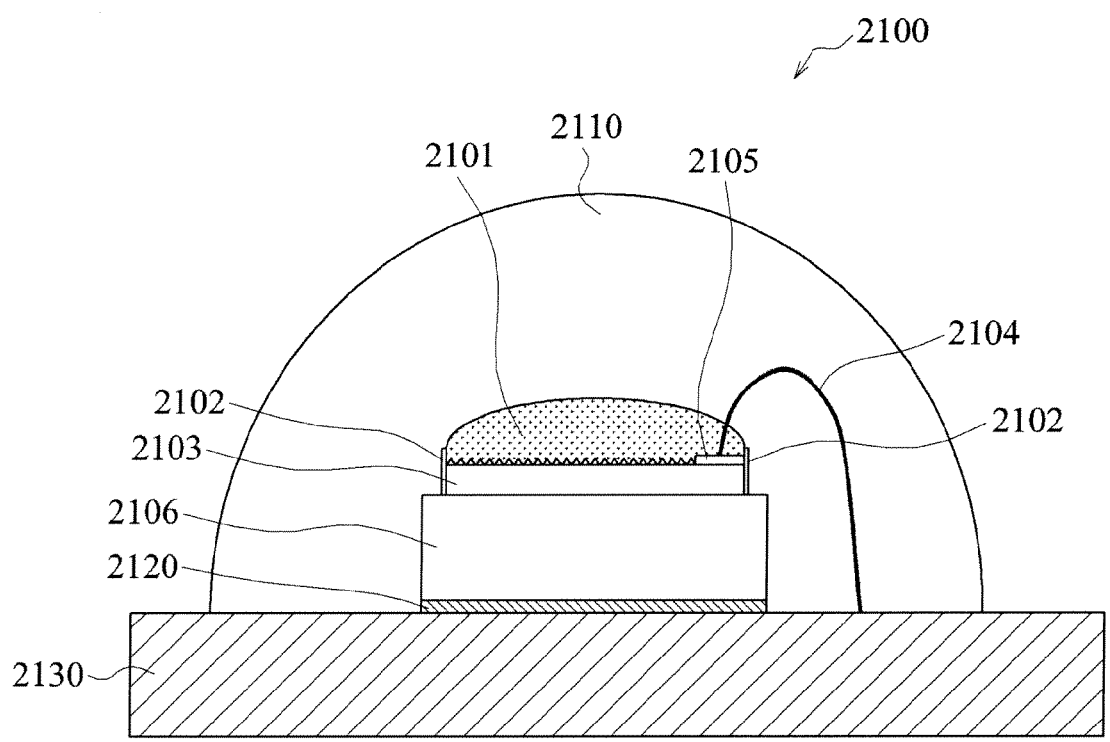
FIG. 11 shows a simplified cross-sectional view of a package structure of a chip-type light emitting device according to an embodiment of the invention.

FIG. 11 shows a simplified cross-sectional view of a package structure 2100 of a chip-type light emitting device according to an embodiment of the invention. As shown in FIG. 11, the package structure 2100 includes a leadframe 2130, an attachment layer 2120 provided on the leadframe 2130, a substrate 2106 provided on the attachment layer 2120, a chip-type light emitting device coupled to the substrate 2106, and a wire 2104 electrically connecting the chip-type light emitting device and the leadframe 2130. As described above, this chip-type light emitting device can include a light emitting semiconductor 2103, a frame 2102, and a wavelength-converting layer 2101. A surface of the light emitting semiconductor 2103 that is adjacent to the wavelength-converting layer 2101 can be roughened. A bonding pad 2105 is provided on the light emitting semiconductor 2103 of the chip-type light emitting device, and the bonding pad 2105 is connected with the wire 2104 such that the chip-type light emitting device is electrically connected to the leadframe 2130. Although only a single wire is shown in the figure, one or more wires can be used in practical situations. A transparent encapsulation layer 2110 can be provided to encapsulate the wavelength-converting layer 2101 and to encapsulate the chip-type light emitting device so that the wavelength-converting layer 2101 and the chip-type light emitting device are not affected by the external environment. The transparent encapsulation layer 2110 is made of at least one of the transparent materials including epoxy resin, silicone resin, polyimide resin, glass, quartz, acryl resin such as PMMA, etc., polycarbonate resin, and parylene resin. The transparent encapsulation layer 2110 can have a convex, a concave, a flat, or a pyramid shape. Alternatively, the transparent encapsulation layer 2110 can have features of a Fresnel lens. Moreover, a light diffusion layer (not shown) can be provided on the transparent encapsulation layer 2110.

In the embodiments of the invention, the first wavelength-converting layer and the second wavelength-converting layer may be the same or different wavelength-converting layers.

Figure 12:
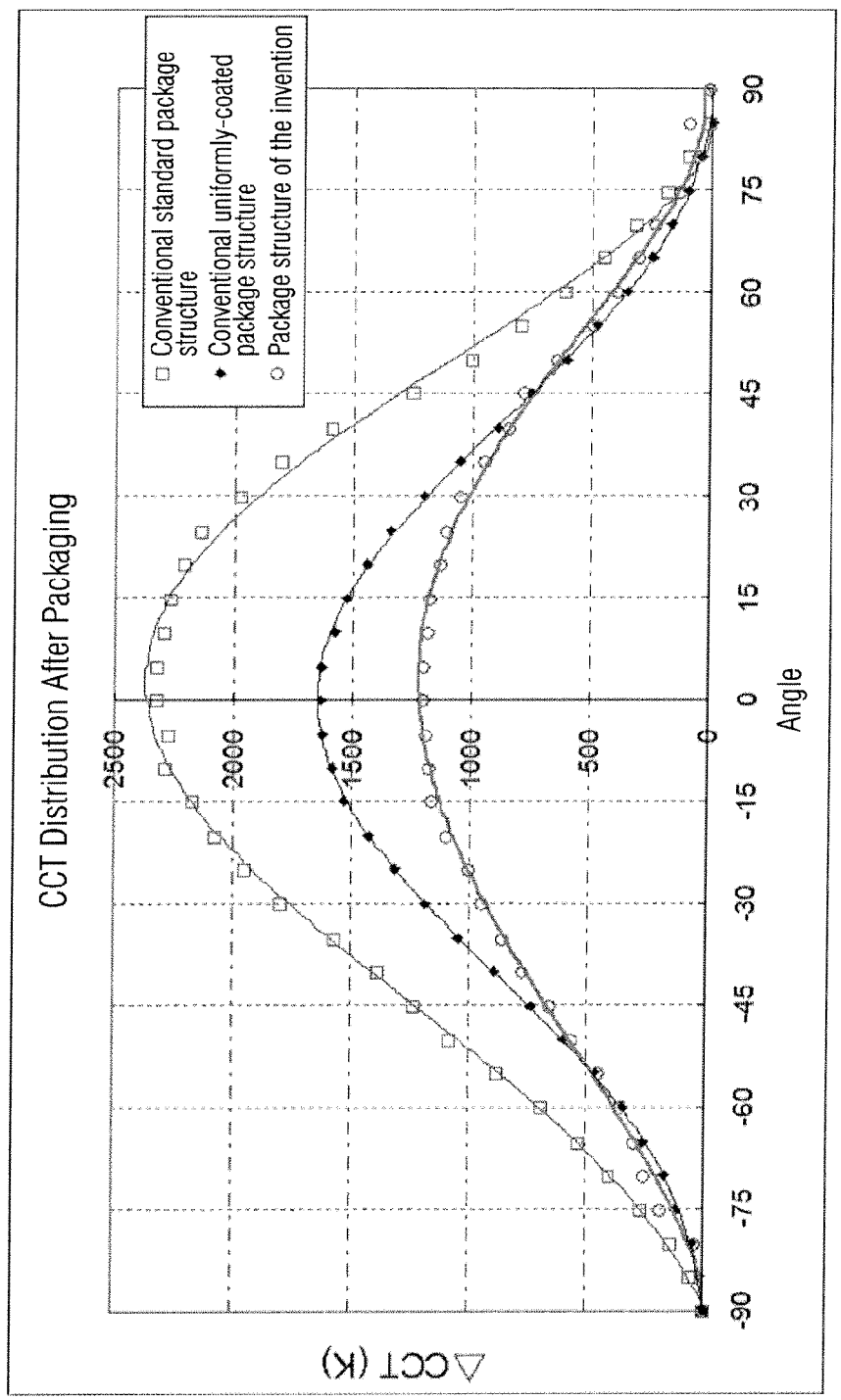
FIG. 12 depicts a graph showing a comparison between the distribution of correlated color temperatures (CCTs) for the package structure of the invention and those of conventional package structures.

FIG. 12 depicts a graph showing a comparison between the distribution of correlated color temperatures (CCTs) for the package structure of the invention and those of conventional package structures. In FIG. 12, the package structure shown in FIG. 11 is used to compare with a conventional standard package structure and a conventional uniformly-coated package structure. As shown in FIG. 12, it is clearly observed that the package structure of the invention exhibits a better CCT-distribution uniformity than the conventional standard package structure and the conventional uniformly-coated package structure.

The frames as disclosed herein can be configured as a dam when filling in a fluorescent mixture such that the fluorescent mixture is confined by the frames after it is filled in so as to prevent the fluorescent mixture from overflowing to other areas in which filling with fluorescent mixture is not desired. A white light can be obtained by converting the emitted lights by the fluorescent mixture within the frames. Additional advantages are facilitating more uniformly distributed correlated color temperatures (CCTs), improving yield with respect to CCT, and reducing dosage of fluorescent particles.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A chip-type light emitting device comprising:
    a substrate;
    a light emitting semiconductor coupled to the substrate configured to emit light having a wavelength, the light emitting semiconductor having a surface area comprising an emitting surface and a side portion;
    a first frame on and contacting the emitting surface of the light emitting semiconductor and a second frame on the substrate; and
    a plurality of wavelength converting layers on the light emitting semiconductor including a first wavelength converting layer in contact with a portion of the light emitting semiconductor and confined by the first frame, the first wavelength converting layer configured to convert the wavelength of the light to a first wavelength, and a second wavelength converting layer in contact with the light emitting semiconductor, encapsulating the first wavelength converting layer, and confined by the second frame, the second wavelength converting layer configured to convert the wavelength of the light to a second wavelength.

2. The chip-type light emitting device of claim 1 wherein the first wavelength and the second wavelength are selected such that the device emits white light having a correlated color temperature.

3. The chip-type light emitting device of claim 1 wherein each wavelength-converting layer includes a plurality of fluorescent particles mixed with an organic chemical.

4. The chip-type light emitting device of claim 3 wherein a weight ratio of the fluorescent particles to the organic chemical is about 0.6 to 8.

5. The chip-type light emitting device of claim 3 wherein the organic chemical comprises a material selected from the group consisting of silicone resin and epoxy resin.

6. The chip-type light emitting device of claim 1 wherein each wavelength-converting layer includes a plurality of fluorescent particles mixed with a glass.

7. The chip-type light emitting device of claim 1 wherein the first frame and the second frame comprise a transparent material.

8. The chip-type light emitting device of claim 1 wherein the first frame and the second frame comprise a metal layer.

9. The chip-type light emitting device of claim 1 further comprising a package containing the chip-type light emitting device comprising a leadframe attached to the substrate and an encapsulating layer encapsulating the light emitting semiconductor.

10. The chip-type light emitting device of claim 9 wherein the first wavelength and the second wavelength are selected such that the package emits white light having a correlated color temperature.

* * * * *